(12) United States Patent
Goenka et al.

(10) Patent No.: US 6,620,545 B2
(45) Date of Patent: Sep. 16, 2003

(54) ETM BASED BATTERY

(75) Inventors: Lakhi N. Goenka, Ann Arbor, MI (US); William F. Quilty, Jr., Levittown, PA (US); Mohan Paruchuri, Canton, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 192 days.

(21) Appl. No.: 09/755,475

(22) Filed: Jan. 5, 2001

(65) Prior Publication Data

US 2002/0142215 A1 Oct. 3, 2002

(51) Int. Cl.[7] .................... H01M 6/46; H01M 4/46; H01M 4/38
(52) U.S. Cl. .................... 429/162; 429/185; 429/220
(58) Field of Search .................... 429/127, 144, 429/162, 185, 220, 206, 207

(56) References Cited

U.S. PATENT DOCUMENTS

| 3,375,136 A | * | 3/1968 | Biggar ................... 205/160 |
| 3,801,388 A | | 4/1974 | Akiyama et al. |
| 3,957,533 A | | 5/1976 | Mead et al. |
| 4,052,787 A | | 10/1977 | Shaheen et al. |
| 4,060,676 A | * | 11/1977 | Dey et al. ................... 429/217 |
| 4,404,059 A | | 9/1983 | Livshits et al. |
| 5,738,797 A | | 4/1998 | Belke, Jr. et al. |
| 6,111,204 A | | 8/2000 | Goenka |

* cited by examiner

Primary Examiner—Patrick Ryan
Assistant Examiner—Gregg Cantelmo
(74) Attorney, Agent, or Firm—Brinks Hofer Gilson & Lione

(57) ABSTRACT

A device for producing an electro-motive force is disclosed. The device includes a cover for creating a liquid seal, an electrolyte contained within the cover for creating an ionic transfer path (medium), and an etched tri-metal board (substrate). The etched tri-metal board has a first conductive layer, a second conductive layer and a third conductive layer. The first, second and third conductive layers are selectively etched to form a cathode and an anode. The cover is sealed against the substrate and filled with an electrolyte to form an electrical device, such as a battery.

14 Claims, 2 Drawing Sheets

ETM BASED BATTERY

TECHNICAL FIELD OF THE INVENTION

This present invention generally relates to etched tri-metal and the formation of electrical devices from an etched tri-metal composite.

BACKGROUND

The use of etched tri-metal circuit boards to create complex micro-electronic systems is well known in the prior art. For example, U.S. Pat. Nos. 4,404,059 issued to Livshits et al.; 3,801,388 issued to Akiyama et al.; and, 5,738,797 issued to Belke et al. all of which are incorporated herein by reference, disclose methods for making printed circuit boards with a substrate having an etched tri-metal layer. These references further disclose a process by which multi-level electrical circuits are created having crossovers and bridges for connecting electronic devices.

While it is well known, in the prior art, how to utilize ETM circuitry, the prior art fails to disclose methods and devices for creating electrical devices from an ETM layer. It would be advantageous to create integrated electrical devices out of the ETM layer to replace conventional surface mounted and multiple pinned device. This integrated approach would reduce manufacturing processes, part count as well as, overall product cost.

Therefore, what is needed are methods for creating electrical devices out from ETM substrates.

SUMMARY OF THE INVENTION

Accordingly, this invention provides a device for producing an electro-motive force. The device includes a cover for creating a liquid seal; an electrolyte contained within the cover for creating an ionic transfer path (medium); and an etched tri-metal board (substrate) having a first conductive layer, a second conductive layer and a third conductive layer. The first, second and third conductive layers are selectively etched to form a cathode and an anode.

In accordance with another aspect of the invention, the cover has an access cap for receiving the electrolyte.

In accordance with yet another aspect of the present invention, a battery for providing electrical power to a circuit board is provided. The battery has a cover for housing a plurality of components of the battery, an electrolyte for providing an ion transfer medium within an interior of the cover, and an etched composite having a first etchable layer, and a second etchable layer. The anode is formed from one of the first and second etchable layers and a cathode is formed from the other of the first and second etchable layers.

Further objects, features and advantages of the invention will become apparent from consideration of the following description and the appended claims when taken in connection with the accompanying drawings.

DETAILED DESCRIPTION OF THE PREFERRED EMBODIMENT

The following description of the preferred embodiment is merely exemplary in nature, and is in no way intended to limit the invention or its application or uses.

Figure 1:
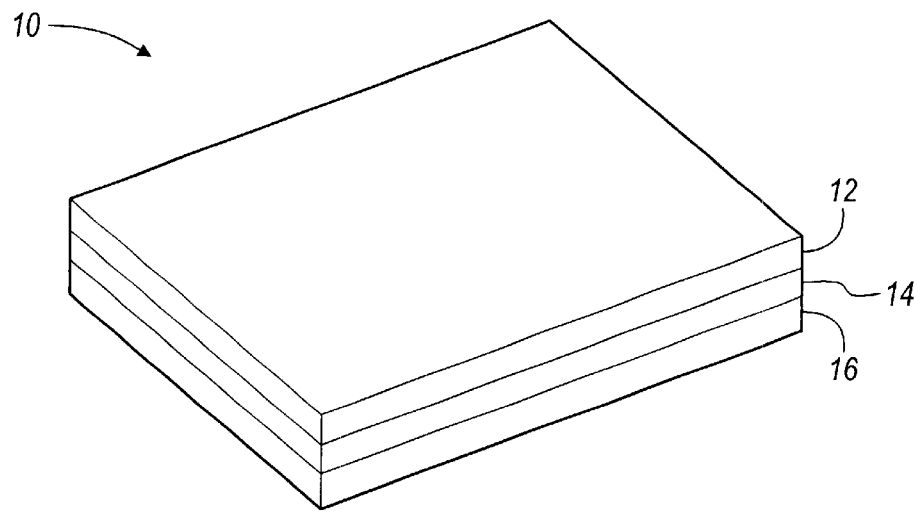
FIG. 1 is a perspective view of an etched tri-metal (ETM) composite, in accordance with the present invention.

Shown in FIG. 1 is an etched tri-metal (ETM) composite generally indicated by reference number 10. ETM composite 10 has three conductive layers 12, 14, and 16. For example, conductive layer 12 may be copper, conductive layer 14 may be aluminum, and conductive layer 16 may be copper. One of ordinary skill in the art is aware that the number of conductive layers may vary and the composition of each of the conductive layers may be changed. For example, conductive layer 12 may be made of aluminum, conductive layer 14 may be made of copper, and conductive layer 16 may be made of aluminum. Preferably, conductive material is selected which is selectively etchable by the application of an etching solution, as well known in the art.

To assist the reader in understanding the present invention, all reference numbers used herein are summarized in the table below, along with the elements they represent:

| Reference Number | Element |
| --- | --- |
| 10 | ETM Composite |
| 12 | Conductive Layer |
| 14 | Conductive Layer |
| 16 | Conductive Layer |
| 30 | Power Source |
| 32 | Cathode |
| 34 | Anode |
| 36 | Housing |
| 38 | Electrolyte Material |
| 52 | Mounting Substrate |
| 54 | Adhesive |
| 56 | Conductive Traces |
| 58 | Conductive Traces |
| 60 | Fill Cap |

Once the ETM composite 10 is selected the conventional etching process is followed to create the desired electrical circuit structure. Generally, the process includes applying a circuit mask over the ETM composite 10 and then exposing the ETM composite to an etchant. The portions of the ETM composite which are not covered by the mask are operated on by the etchant. The application of the etchant for a specified amount of time selectively removes the exposed conductive layer. This process of applying the mask followed by application of the etchant and then removal of the etchant is repeated until a multi-level circuit pattern is achieved.

Figure 2:
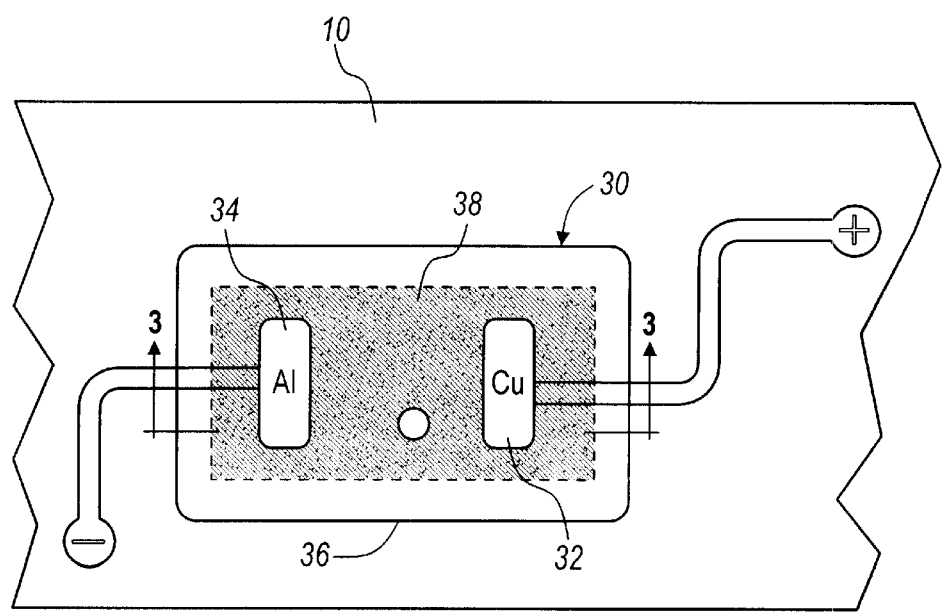
FIG. 2 is a plan view of an ETM battery, in accordance with the present invention.

Many electronic circuits today require an onboard power source, such as a battery. As illustrated in FIG. 2, such a power source or battery 30 is illustrated, in accordance with the present invention. Power source 30 is formed from the ETM composite 10 through conventional ETM processing, as described above. Preferably, power source 30 is a battery having a cathode 32 and an anode 34 formed out of dissimilar conductive material in the ETM composite 10. For example, in an ETM composite comprised of a copper layer, aluminum layer, and a copper layer, anode 34 is formed out of the aluminum layer while cathode 32 is formed out of the copper layer. Of course, anode 34 and cathode 32 may be formed from other metals and other layers of the ETM composite.

Further power source 30 includes a housing 36 that sealingly mates with the ETM composite 10. Contained within housing 36 is an electrolyte material that provides a medium for transferring ions between anode 34 and cathode 32 elements. Electrolytes such as diluted sodium hydroxide, hydrochloric acid, or any other aluminum etching solutions may be used. In an embodiment of the present invention, an electrolyte having about 1.20 grams of $NaH_2PO_4$, about 0.885 grams of $Na_2HPO_4$ diluted to about 1 $dm^3$ with water is used. Thus, a device formed by sealingly mating housing 36 with ETM composite 10 and filling the housing with the electrolyte material is, for example, a battery. Such a device may be used to power other electronic devices mounted on the ETM substrate.

Figure 3:
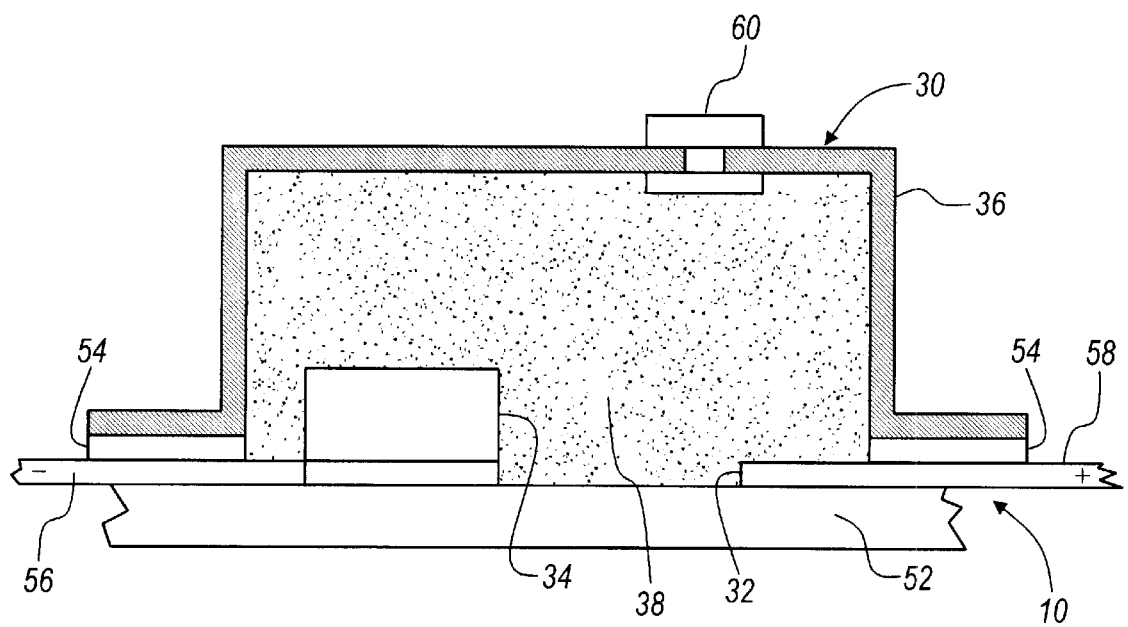
FIG. 3 is a cross-sectional view through the ETM based battery as indicated in FIG. 2, in accordance with the present invention.

Referring now to FIG. 3, a cross-sectional view of power source 30 is further illustrated, in accordance with the present invention. As shown in FIG. 3, ETM composite 10 is mounted to a mounting substrate 52 such as an epoxy glass board to create a rigid circuit board structure. Housing 36 is sealingly mated with the tri-metal composite 10 using an adhesive 54, such as epoxy or by other conventional means. If the housing is made of an electrically conductive material a nonconductive adhesive may be disposed between housing 36 and the ETM composite 10. Conductive traces 56 and 58 connect the anode 34 and cathode 32 respectively to the rest of the circuit external to source 30.

With continuing reference to FIG. 3, a fill cap 60 is provided in accordance with the present invention. Fill cap 60 allows the electrolyte material 38 to be received into an interior of housing 36. Another benefit of fill cap 60 is that the electrolyte material may be replaced after a specified period of time in operation.

The present invention has many advantages and benefits over the prior art. For example, the present invention provides an integrated power source which may be easily manufactured during conventional ETM circuit board processing. Moreover, since the power source is integrated into the circuit board, fewer components are required and a reduced overall board size may be achieved.

The foregoing discussion discloses and describes a preferred embodiment of the invention. One skilled in the art will readily recognize from such discussion, and from the accompanying drawings and claims, that changes and modifications can be made to the invention without departing from the true spirit and fair scope of the invention as defined in the following claims.

We claim:

1. A device for producing an electro-motive force for providing electrical energy to electronic devices in an electrical circuit, the device comprising:
   a housing;
   an electrolyte contained within the housing for creating an ionic transfer medium; and
   a metallic substrate matingly sealed to the housing, the metallic substrate having at least three metal layers wherein one of the at least three metal layers includes an etched surface defining a cathode element and another of the at least three metal layers includes an etched surface defining an anode element.

2. The device of claim 1 wherein the housing has an access aperture for receiving the electrolyte.

3. The device of claim 1 wherein the electrolyte is an aluminum etching solution.

4. The device of claim 1 wherein the metallic substrate has three etched metallic layers.

5. The device of claim 4 wherein the three etched metallic layers further include a first copper layer, an intermediate aluminum layer, and a second copper layer.

6. The device of claim 5 wherein the first copper layer forms the anode element of the device.

7. The device of claim 5 wherein the intermediate aluminum layer forms the cathode element of the device.

8. A battery for providing electrical power to a circuit board, the battery comprising:
   a cover;
   an electrolyte for providing an ion transfer medium within an interior of the cover; and
   an etched metallic substrate matingly sealed to cover forming a liquid seal the etched metallic substrate having a first etched metal layer defining an anode of the battery, and a second etched metal layer defining a cathode of the battery.

9. The battery of claim 8 wherein the cover further comprises an access aperture for receiving the electrolyte into the interior of the housing.

10. The battery of claim 8 wherein the electrolyte is an aluminum enchant solution.

11. The battery of claim 8 wherein the etched metallic substrate has a third etched metal layer.

12. The battery of claim 11 wherein the first etched metal layer is a first copper layer, the second etched metal layer is an intermediate aluminum layer, and the second etched metal layer is a second copper layer.

13. The battery of claim 12 wherein the first copper layer forms the anode of the battery.

14. The battery of claim 12 wherein the intermediate aluminum layer forms the cathode of the battery.

* * * * *